(12) United States Patent
Poullet et al.

(10) Patent No.: US 7,643,978 B2
(45) Date of Patent: Jan. 5, 2010

(54) DETERMINATION OF THE VOLTAGES OF AN ELECTRIC CIRCUIT

(75) Inventors: Frédéric Poullet, Vizille (FR); Xavier Avon, Grenoble (FR)

(73) Assignee: Dolphin Integration, Meylan (FR)

( * ) Notice: Subject to any disclaimer, the term of this patent is extended or adjusted under 35 U.S.C. 154(b) by 416 days.

(21) Appl. No.: 10/948,118

(22) Filed: Sep. 23, 2004

(65) Prior Publication Data

US 2005/0065764 A1    Mar. 24, 2005

(30) Foreign Application Priority Data

Sep. 23, 2003   (FR)   .................................. 03 50588

(51) Int. Cl.
*G06F 17/50*   (2006.01)
(52) U.S. Cl. ........................................ 703/14
(58) Field of Classification Search ............... 703/14
See application file for complete search history.

(56) References Cited

U.S. PATENT DOCUMENTS 6,615,164 B1 *  9/2003  Gopisetty et al. ............... 703/2
6,928,626 B1 *  8/2005  McGaughy et al. ............ 716/1

OTHER PUBLICATIONS

Gaofeng Wang et al.; "Efficient Generation of Timing and Power Polynomial Models from Lookup Tables for SoC Designs", 1999, Proceedings of the Twelfth Annual IEEE International ASIC/SOC Conference, pp. 216-220.*

Y.-H. Jun et al.; "Piecewise Polynomial models for MOSFET DC characteristics with continuous first order derivative", Dec. 1988, IEE Proceedings G Circuits, Devices and Systems, vol. 135, No. 6, pp. 241-246.*
James A. Barby et al.; "Polynomial Splines for MOSFET Model Approximation", May 1988, IEEE Transactions on Computer-Aided Design, vol. 7, No. 5, p. 557-566.*
Paap, K. L. et al.: "Saint: simulation assistant for analog simulation" 1998, San Diego, CA, USA, SCS, USA, 1998, pp. 183-187.
Saleh, R. A. et al.: "Multilevel and Mixed-Domain simulation of Analog circuits and Systems" IEEE Transactions on Computer Aided Design of Integrated Circuits and Systems, IEEE Inc. New York, US, vol. 15, No. 1, 1996, pp. 68-82.
Descleves, C.: "A Mixed-Mode Multi-Level Simulator", Electronic Engineering, Morgan- Grampian Let. London, GB, vol. 67, No. 821, May 1, 1995, pp. S61-S62, S64.

* cited by examiner

*Primary Examiner*—Paul L Rodriguez
*Assistant Examiner*—Russ Guill
(74) *Attorney, Agent, or Firm*—Howard IP Law Group, PC

(57) ABSTRACT

A method for simulating an electric circuit comprising components and receiving external stimuli, wherein the determination at a given time of the voltages at the circuit nodes comprises several iterations, each consisting of defining a probable voltage for each node, of calculating the currents of each component based on the component model, then of repeating until the mesh equation is verified, and wherein for the first time, a current of a component is calculated based either on the full accurate model, or on the simplified linear model, or on the compound model which is a fitting, according to the interval between the voltages at the component's terminals between the initial time and the first time, and the simplified, full or compound model is used respectively if the interval is smaller than a first threshold, greater than a second threshold or between the first and second thresholds.

7 Claims, 4 Drawing Sheets

DETERMINATION OF THE VOLTAGES OF AN ELECTRIC CIRCUIT

CLAIM FOR PRIORITY

This application claims the benefit of French Application No. 03/50588, filed Sep. 23, 2003 and is incorporated herein by reference.

BACKGROUND OF THE INVENTION

1. Field of the Invention

The present invention relates to the simulation of an electric circuit and more specifically to methods for determining time variations of the voltages and of the currents of an electric circuit according to external stimuli. The present invention particularly applies to electric circuits comprising analog components such as transistors, resistors, capacitors, diodes, and inductances.

2. Discussion of the Related Art

FIG. 1 is an example of a simple circuit comprising a diode d and a variable resistor r in series between an upper power supply terminal vdd and a lower power supply terminal gnd. Value R of resistor r is controlled by a control signal C. In this example, it is desired to determine the voltage at node N between the anode of diode d and resistor r as well as the current flowing through resistor r and diode d.

FIG. 2 is a graph showing the variations of the current in each component according to voltage $V_N$ at node N. Curve Cd shows the variations of current $i_d$ flowing through diode d according to voltage $V_N$. Straight line Cr shows the variations of current $i_r$ flowing through resistor r according to voltage $V_N$ for a given voltage $V_C$.

It is possible to determine, based on this diagram, the current flowing through resistor r and diode d as well as voltage $V_N$ at node N. Indeed, according to the mesh equation, current $i_d$ flowing through diode d is equal to current $i_r$ flowing through resistor r. Crosspoint $P_0$ of straight line Cr and of curve Cd corresponds to a current $i_0$ and to a voltage $V_{N0}$ for which the current in diode d is equal to the current in resistor r.

The above-described circuit example is extremely simple and the mathematical models of operation of diode d and of resistor r are also very simple. Generally, in the field of electric circuit simulation, the analyzed circuits may comprise several hundreds of components and the mathematical models of the operation of each component may comprise several tens of equations. Conversely to the previous example where the determination of current $i_0$ and of voltage $V_{N0}$ consists of solving a simple equation, the determination of the voltages and of the currents of a more complex circuit requires solving a large number of generally non-linear differential equations. In practice, the determination of the voltages and of the currents of an electric circuit is performed according to an iterative method described hereafter based on the simple example illustrated in FIG. 1.

FIG. 3 is a graph similar to the graph of FIG. 2. Straight lines Cr0 and Cr1 show the variations of current $i_r$ flowing through resistor r according to voltage $V_N$ for two different values of voltage $V_C$, respectively $V_{C0}$ and $V_{C1}$, $V_{C1}$ being greater than $V_{C0}$. Curve Cd shows, as previously, the variations of current $i_d$ in diode d according to voltage $V_N$.

At a time $t_0$, voltage $V_C$ is equal to $V_{C0}$. Voltage $V_N$ and currents $i_d$ and $i_r$ are considered as known and as being equal respectively to $V_{N0}$, $i_0$ and $i_0$, voltage $V_{N0}$ and current $i_0$ corresponding to crosspoint $P_0$ of straight line Cr0 and of curve Cd.

At a time $t_1$ following $t_0$, voltage $V_C$ switches and becomes equal to $V_{C1}$. The determination of voltage $V_N$ and of currents $i_d$ and $i_r$ is then performed according to the following method.

The direction of the variation of voltage $V_N$ is not known a priori, and the assumption is made that voltage $V_N$ at time $t_1$ is unchanged and equal to $V_{N0}$. Current $i_d$ at time $t_1$ is then calculated based on the model of diode d. Current $i_d$ is equal to current $i_0$ since the voltages across the diode have not changed. Still in the assumption that voltage $V_N$ is unchanged at time $t_1$, current $i_r$ at time $t_1$ is calculated based on the model of resistor r for a control voltage $V_C$ equal to $V_{C1}$. Current $i_r$ is equal to current $i_{r,a}$ corresponding to point $P_{r,a}$ of straight line Cr1 for a voltage $V_N$ equal to $V_{N0}$.

The mesh equation is then verified at node N. In other words, it is checked whether current $i_d$ is equal to current $i_r$. In this example, currents $i_0$ and $i_{r1,a}$ are obviously different, as appears from FIG. 3.

The derivative of current $i_d$ according to voltage $V_N$ is then calculated for a voltage $V_N$ equal to $V_{N0}$. The equation of tangent $T_{d,a}$ to curve Cd at point $P_0$ can then be defined. Similarly, the derivative of current $i_r$ according to voltage $V_N$ is calculated for a voltage equal to $V_{N0}$. Then, the equation of tangent $T_{r,a}$ to curve Cr1 at point $P_{r,a}$ is defined. Tangent $T_{r,a}$ is in fact confounded with straight line Cr1.

Tangents $T_{d,a}$ and $T_{r,a}$ previously calculated indicate the direction of the variation of currents $i_r$ and $i_d$ when voltage $V_N$ varies around $V_{N0}$. Tangent $T_{d,a}$ is a simplified representation of curve Cd which enables making estimations of the value of the current according to the direction of the variation of voltage $V_N$. Crosspoint $P_C$, a of the two tangents $T_{d,a}$ and $T_{r,a}$ is then identified. Crosspoint $P_{C,a}$ enables identifying a voltage $V_N$ equal to $V_{NC,a}$ for which currents $i_r$ and $i_d$ are likely to be identical. A new assumption about the value of voltage $V_N$ at time $t_1$ is then made by taking it equal to voltage $V_{NC,a}$.

The currents $i_d$ and $i_r$ corresponding to voltage $V_{NC,a}$ are calculated. Current $i_r$ is equal to current $i_{C,a}$ corresponding to point $P_{C,a}$. Current $i_d$ is equal to current $i_{d,b}$ corresponding to point $P_{d,b}$ of curve Cd for a voltage $V_N$ equal to $V_{NC,a}$.

The mesh equation is then verified again at node N. Currents $i_{C,a}$ and $i_{d,b}$ are not strictly equal but their difference is small. If the desired accuracy is low, voltage $V_N$ at time $t_1$ is considered as equal to voltage $V_{NC,a}$ and the current flowing through diode d and resistor r is considered as equal to $i_{C,a}$. In the opposite case, the search for voltage $V_N$ and the current flowing through diode d and resistor r is refined by calculating the equations of tangents $T_{d,b}$ and $T_{r,b}$ respectively at points $P_{d,b}$ and $P_{C,a}$ to make a new assumption as to voltage $V_N$. The currents for this new voltage $V_N$ equal to $V_{NC,b}$ are then calculated and the mesh equation is verified again. The search is continued until converging towards sufficiently close currents.

Generally, a simulation of a circuit such as that in FIG. 1 aims at determining the voltages and the currents of a circuit receiving stimuli. The initial state of the circuit is first determined from the initial values of the stimuli at an initial simulation time $t_0$. For this purpose, default voltage values are given to each circuit node, after which a first series of "convergence" iterations are performed according to a method identical to that described hereabove, until initial voltages and currents entering or coming out of each of the circuit components which comply with the mesh equation for these initial voltages are obtained. The circuit state at a time $t_1$ following time $t_0$ is then determined, the time elapsed between time $t_0$ and time $t_1$ corresponding to the simulation "step". The circuit state at time $t_1$ is determined by a second series of iterations such as that described hereabove in relation with FIG. 3, with the assumption that the voltages are unchanged. The circuit state at following times $t_2$ to $t_n$, where n is a positive integer, is then determined. The determination of the voltages at a given time $t_j$, j ranging between 2 and n, consists of defining "start" voltages prior to the implementation of a series of convergence iterations. The definition of the "start" voltages takes into account the voltages calculated at the preceding times. An extrapolation may for example be performed by taking into account the voltages calculated for the last two times.

The use of conventional simulation methods such as that described hereabove results in long simulation durations. Such durations become prohibitive when more and more complex circuits are desired to be simulated by using more and more accurate and more and more complex component models. The number of simulation steps then has to be reduced.

SUMMARY OF THE INVENTION

An object of the present invention is to provide a faster method for determining time variations of the voltages and currents of a circuit to enable full simulations within reasonable times.

To achieve this object, the present invention provides a method for simulating an electric circuit comprising elementary components having each of their terminals connected to a circuit node, some nodes receiving external stimuli consisting of a series of voltage values applied at successive simulation times, wherein the determination at a given time of the voltages at the circuit nodes consists of performing one or several calculation iterations, each iteration consisting of defining a probable voltage for each node, of calculating the currents entering or coming out of each of the components by using for each component a model of current calculation according to the voltages at the component's terminals, then of verifying the mesh equation for each node, the iteration series continuing until the mesh equation is verified, and wherein for the first simulation time following the initial simulation time, in a calculation iteration, a current entering or coming out of a given component is calculated based on one of three simplified, compound, or full models, the full model enabling very accurately knowing the value of the current according to the voltages at the component's terminals, the simplified model corresponding to a tangential linearization of the full model around the value of the current corresponding to the voltages at the component's terminals determined for the initial time, the compound model being a fitting of the simplified and full models by ensuring the continuity of the currents, the selection of a model being a function of the interval between the voltages at the component's terminals determined for the initial simulation time and those believed to be probable for the first simulation time, so that for each component: if the interval is smaller than a first threshold defined for this component, the simplified model is used; if the interval is greater than a second threshold defined for this component, this second threshold being greater than the first threshold, the full model is used; and if the interval ranges between the first and second thresholds for this component, the compound model is used.

According to an alternative implementation of the above-mentioned method, for a given simulation time, the first calculation iteration comprises, prior to the calculation of the currents, an additional step consisting of selecting for each component a simulation time prior to the given time for which the currents entering or coming out of the component have been calculated based on the full model of the component, the calculation of a current entering or coming out of a given component, in the first iteration and the following ones, being performed based on one of the three simplified, compound, or full models, the simplified model being defined around the value of the current corresponding to the voltages at the component's terminals determined for said prior simulation time, the selection of a model being a function of the interval between the voltages at the component's terminals determined for the previous selected time and those believed to be probable for the simulation time given as the first time.

According to an alternative implementation of the above-mentioned method, for a component with n terminals, said interval is equal to the distance between first and second points of an n-dimensional space, the first point having as coordinates the voltages at the component's terminals believed to be probable for the given time, and the second point having as coordinates the voltages at the component terminals determined for the selected previous time.

According to an alternative implementation of the above-mentioned method, all the possible values of a current entering or coming out of a given component corresponding to the full model of the component forms a first hypersurface shown in an n+1-dimensional space comprising a current axis and said voltage space, the sets of points of said voltage space, distant from the second point by a value equal to the first threshold voltage or equal to the second threshold voltage, form first and second hyperspheres, the set of current values representative of the simplified model of the component forms a portion of a hyperplane tangent to the first hypersurface for a current corresponding to the second point, each of the currents of the hyperplane portion corresponding to a point located within the first hypersphere, the set of current values representative of the compound component model forms a second hypersurface of fitting between the hyperplane portion and a subset of current values of the first hypersurface corresponding to the points of the second hypersphere.

According to an alternative implementation of the above-mentioned method, the compound component model is partially defined as follows when said interval ranges between the first and second thresholds: defining third and fourth points corresponding to the intersection between an axis having as an origin the second point and passing through the first point and the first and second hyperspheres; calculating third and fourth currents corresponding to the third and fourth points based respectively on the simplified and full models of the component, and determining a third set of current values for each of the points of said axis between the third and fourth points, the third set of current values linking the third and fourth current values, the current value calculated for the first point being the current value of the third set corresponding to the first point.

According to an alternative implementation of the above-mentioned method, said previous simulation time is the time closest to the given time for which the currents entering or coming out of the component have been calculated based on the full component model.

According to an alternative implementation of the above-mentioned method, said previous simulation time is such that the voltages at the component's terminals determined for this previous time are the closest to the voltages at the component's terminals believed to be probable for the given time and such that, for the voltages at the component's terminals determined for this time, the currents entering or coming out of the corresponding component have been calculated based on the full model of the component.

The foregoing object, features, and advantages of the present invention, as well as others, will be discussed in detail in the following non-limiting description of specific embodiments in connection with the accompanying drawings.

DETAILED DESCRIPTION

The present invention is based on the finding by the present inventor that a great part of the simulation time is used to calculate the currents based on often very complex mathematical models of each component. Indeed, the calculation of the currents entering or coming out of a connection pad of a component according to the voltages estimated for the nodes to which its connection pads are connected consists of performing an often very long series of operations. As an example, the calculation of a current of a transistor according to the voltages on its electrodes requires several hundreds of calculation operations.

The present inventor has further noted that, in the calculation of the currents of a component, the performed operation sequence always comprises the calculation of the derivatives of each current according to the various voltages at the nodes of which the component is connected. This finding enables envisaging a faster simulation method, as will appear hereafter.

Figure 4:
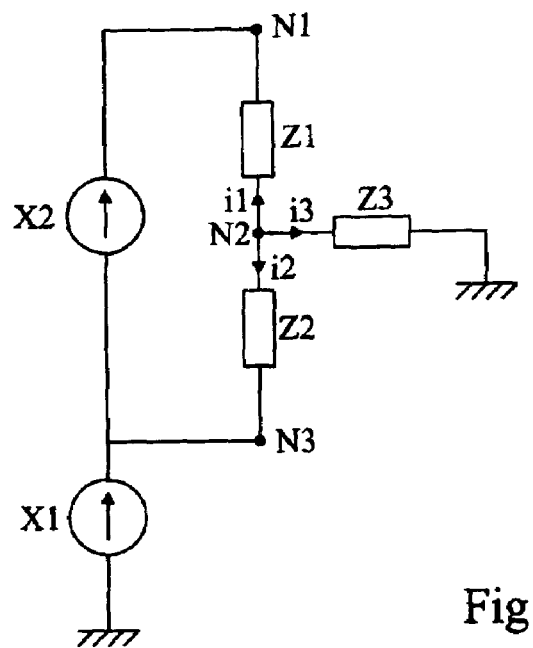
FIG. 4 is a diagram of another example of a circuit.

FIG. 4 is an example of an electric circuit comprising three two-terminal components Z1, Z2, and Z3. Components Z1 is placed between a node N1 and a node N2, component Z2 is placed between node N2 and a node N3, and component Z3 is placed between node N2 and the ground. A voltage source X1 is placed between node N3 and the ground. A voltage source X2 is placed between node N1 and node N3.

In the simulation of the circuit of FIG. 4, voltage $V_{N2}$ at node N2 is desired to be determined according to voltages $V_{N1}$, $V_{N3}$ applied on nodes N1 and N3 via voltage sources X1 and X2. Further, the currents entering or coming out of components Z1 to Z3 are desired to be known. By convention in the following description, the algebraic value of the currents entering a component through one of its connection pads is desired to be known. The currents entering components Z1, Z2, and Z3 from node N2 are respectively called i1, i2, and i3.

Figure 5:
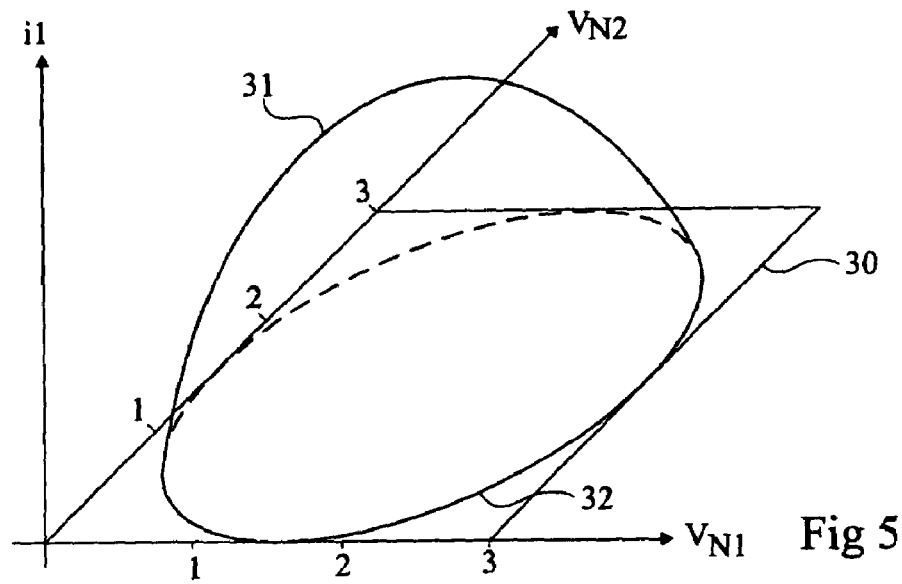
FIG. 5 is a three-dimensional representation of the values of a current according to voltages at the two terminals of a component corresponding to the "full" component model.

FIG. 5 is a three-dimensional representation of one of the currents, in this example i1, entering one of the components, Z1, according to voltages $V_{N1}$ and $V_{N2}$ on the component terminals. Current i1 varies along a vertical axis. Voltage $V_{N1}$ varies along a horizontal axis. Voltage $V_{N2}$ varies along an axis perpendicular to the sheet plane and schematically represented with a 45° angle with respect to each of the axes, as current in a three-dimensional representation. As an example, voltage sources X1 and X2 are such that voltages $V_{N1}$ and $V_{N2}$ can take a value ranging between 0 and 3 volts. The set of voltage couples ($V_{N1}$,$V_{N2}$) is represented by a parallelogram-shaped planar portion 30. The set of values of current i1 is represented by a surface comprising a semi-sphere 31 resting on plane portion 30. The intersection of semi-sphere 31 and of plane portion 30 is a circle 32 having as a center the voltage couple ($V_{N1}$,$V_{N2}$) equal to 1.5/1.5 volts, and as a radius 1.5 volts, so that the circle touches the midpoints of each of the sides of plane portion 30. Current i1 is maximum for the voltage couple ($V_{N1}$, $V_{N2}$) equal to 1.5/1.5 volts. Current i1 is zero for all the voltage couples ($V_{N1}$, $V_{N2}$) placed outside of circle 32.

The component model illustrated in FIG. 5 is given as an example. Generally, to each electric circuit component type is associated a "full" model enabling accurately knowing the value of each of the currents entering the component according to the voltages at its terminals. In the case where the component has k terminals, the representation of a current according to the voltages on each of the k terminals is performed in a k+1-dimensional space.

Figure 1:
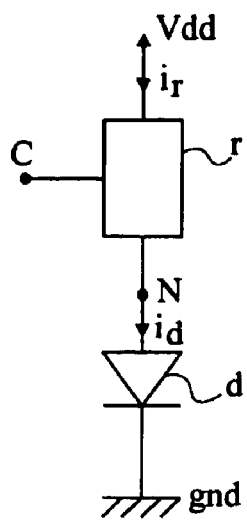
FIG. 1 is a diagram, previously described, of an example of an electric circuit.
Figure 2:
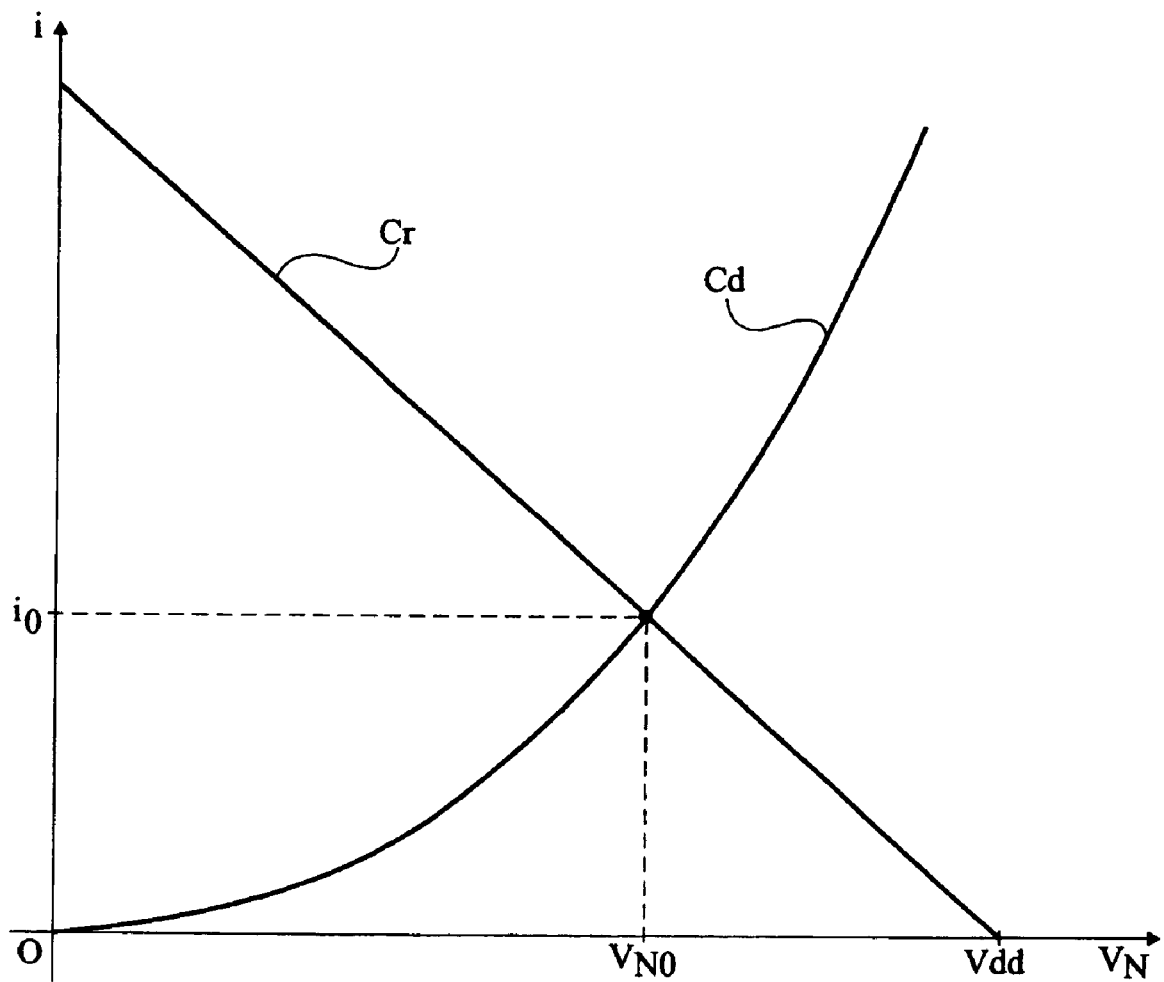
FIG. 2 is a graph showing the current of each component of the circuit of FIG. 1 versus the voltages at its terminals.
Figure 3:
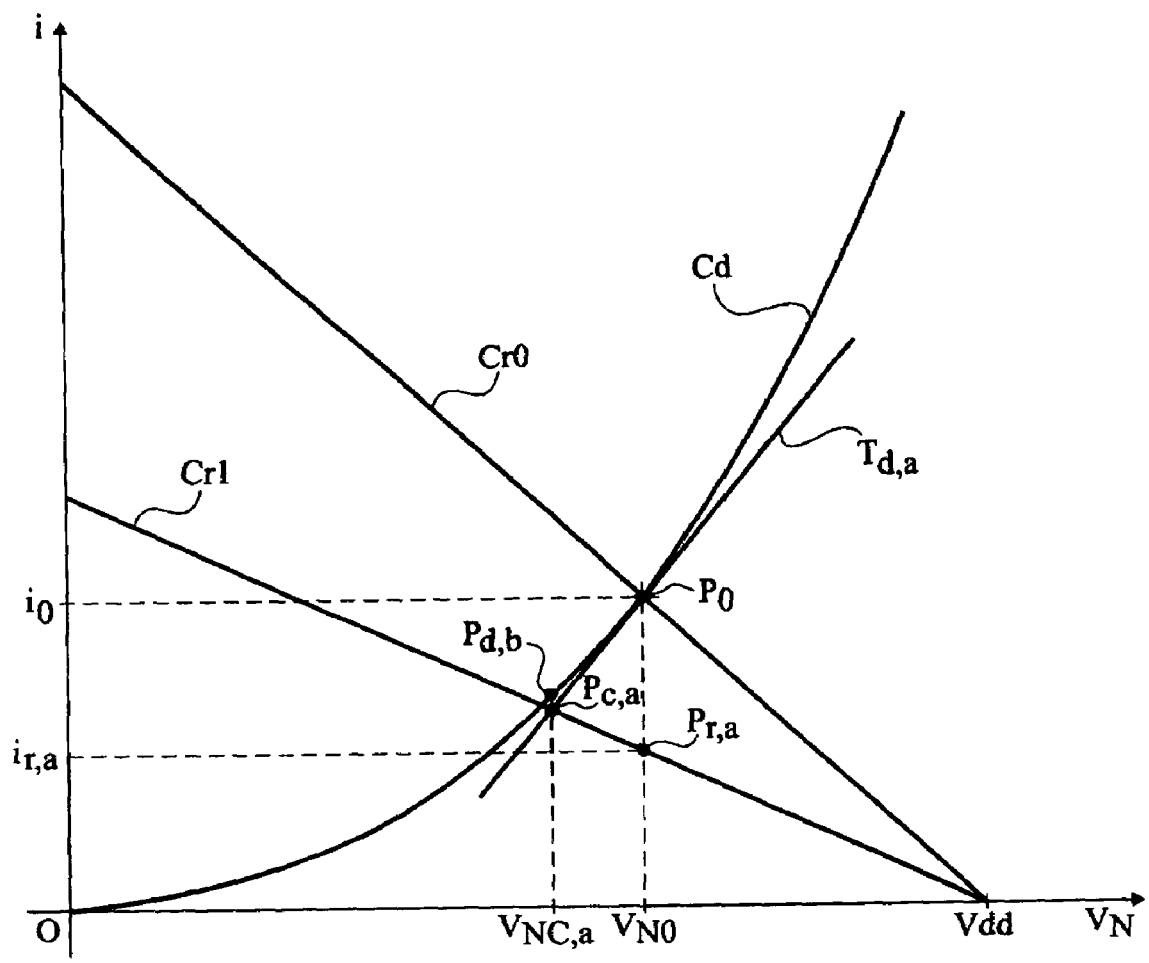
FIG. 3 is a graph similar to that of FIG. 2 in which various elements of the method implemented in the simulation are shown.

The simulation method of the present invention consists, as previously described in relation with FIGS. 1 to 3, of determining voltage $V_{N2}$ for each time $t_j$ by performing a series of convergence iterations. At each iteration, the simulator determines a probable voltage $V_{N2}$, after which it "interrogates" the models of each of the components to know the value of the currents entering each of the components. The iteration series continues as long as the mesh equation has not been verified at node N2. The present invention aims at improving the method of model interrogation at each iteration. The method of the present invention is described hereafter for the calculation of current i1 entering component Z1.

The method of the present invention aims at accelerating the calculation of current i1 by using a "simplified" model of component Z1 when a voltage couple ($V_{N1}$, $V_{N2}$) previously determined at a previous time of the simulation is close to a voltage couple ($V_{N1}$, $V_{N2}$) estimated as being a probable couple for simulation time $t_j$. Although voltage $V_{N1}$ at time $t_j$ is imposed, and thus known, the current calculation is performed from the voltage values of all the nodes, N1 and N2, to which Z1 is connected.

Figure 6:
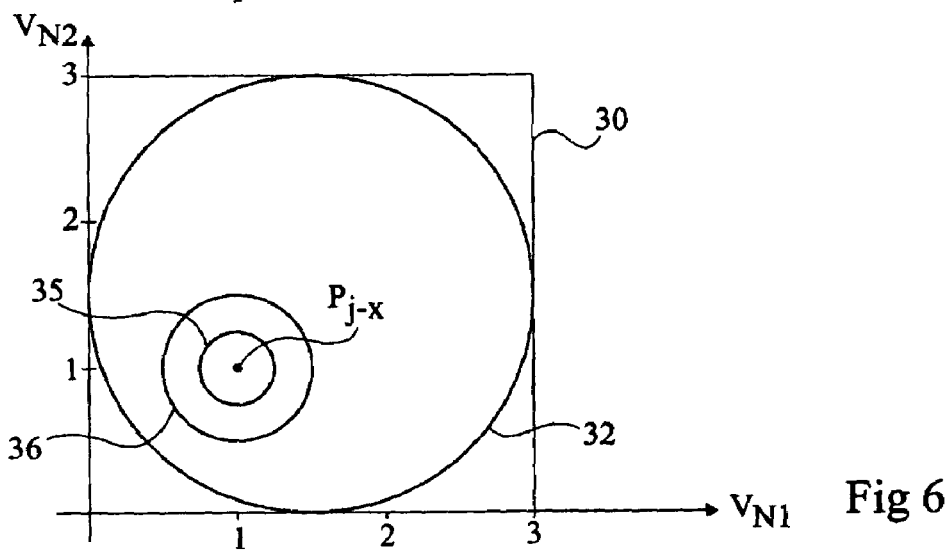
FIG. 6 is a two-dimensional representation of the set of voltages couples on the terminals of a component.

FIG. 6 shows the set of couples $V_{N1}$, $V_{N2}$ belonging to plane portion 30 shown in FIG. 5. Voltage $V_{N1}$ varies along a horizontal axis and voltage $V_{N2}$ varies along a vertical axis. Plane portion 30 has in FIG. 6 the shape of a square. Circle 32 is placed inside of plane portion 30.

In the method of the present invention, it is estimated, in the first iteration of a series of iterations enabling determining the circuit state at time $t_j$, whether the voltage couple $(V_{N1}, V_{N2})_j$ estimated as being probable for simulation time $t_j$ is remote or not from a voltage couple $(V_{N1}, V_{N2})_{j-x}$ determined for a previous simulation time $t_{j-x}$, where x ranges between 1 and j. The selection of previous time $t_{j-x}$ will be described hereafter. Couple $(V_{N1}, V_{N2})_j$ corresponds to a point $P_j$ of plane portion 30. Voltage couple $(V_{N1}, V_{N2})_{j-x}$ corresponds to a point $P_{j-x}$ of coordinates 1/1 in this example. The estimation of the remoteness between points $P_{j-x}$ and $P_j$ may consist of determining the distance between these two points. The distance between the two points is representative of a voltage difference equal to:

$$\sqrt{(V_{N1,p}-V_{N1,r})^2+(V_{N2,p}-V_{N2,r})^2}$$

where $V_{N1,p}$ is the voltage $V_{N1}$ estimated for time $t_j$, $V_{N2,p}$ is the voltage $V_{N2}$ estimated for time $t_j$, $V_{N1,r}$ is the voltage $V_{N1}$ retained for time $t_{j-x}$ and $V_{N2,r}$ is the voltage $V_{N2}$ retained for time $t_{j-x}$.

In the case where the calculated distance is smaller than a threshold voltage Vs1, the present invention provides that the current calculation will be performed based on a "simplified" model of the component defined hereafter. In this example, threshold voltage Vs1 is selected to be equal to 0.25 volt. The set of points of plane 30 having their distance to point $P_{j-x}$ smaller than threshold voltage Vs1 is a surface delimited by a circle 35, having as a center point $P_{j-x}$ and as a radius Vs1. In the case where the calculated distance is greater than a second threshold voltage Vs2, threshold voltage Vs2 being greater than threshold voltage Vs1, the present invention provides that the current calculation will be performed from the full component model such as shown in FIG. 5. Threshold voltage Vs2 is in this example equal to 0.5 volt. The set of points of plane portion 30 having their distance to point $P_{j-x}$ greater than threshold voltage Vs2 is placed outside of a circle 36 of center $P_{j-x}$ and of radius Vs2. In the case where the calculated distance is greater than threshold voltage Vs1 and smaller than threshold voltage Vs2, the present invention provides that the current calculation will be performed based on a "compound" model defined hereafter.

Figure 7:
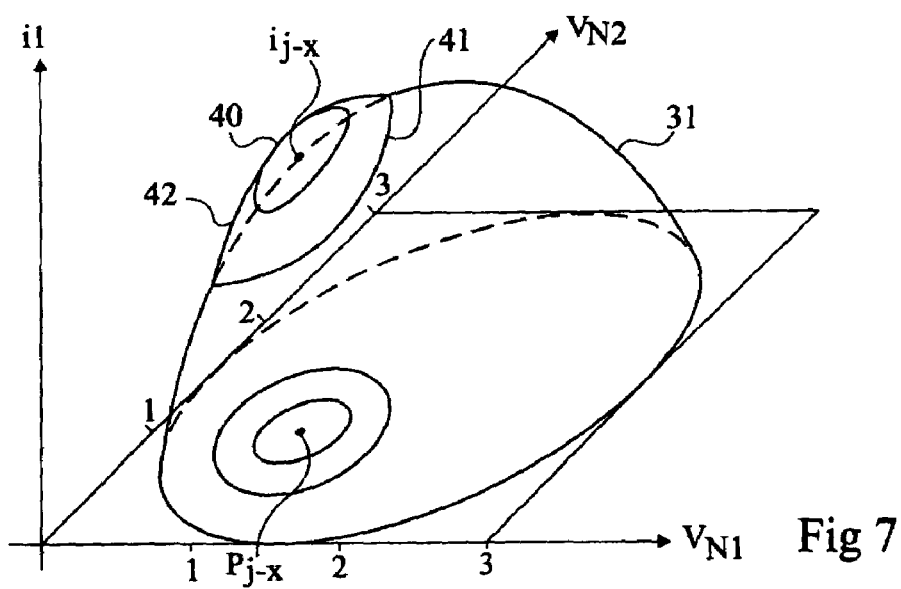
FIG. 7 is a three-dimensional representation of the values of a current according to voltages at the two terminals of a component showing the three models used in the method of the present invention.

FIG. 7 is a representation of current i1 versus voltages $V_{N1}$ and $V_{N2}$ comprising all the elements shown in FIG. 5 as well as the representation of the previously-mentioned "simplified" and "compound" models.

The definition of the simplified model is the following. Previous time $t_{j-x}$ has been selected so that the full model of the component has been used to calculate the current $i_{j-x}$ corresponding to voltage couple $(V_{N1}, V_{N2})_{j-x}$ determined for previous time $t_{j-x}$. Current $i_{j-x}$ is indicated in FIG. 7 on semi-sphere 31 above point $P_{j-x}$. In the calculation of current $i_{j-x}$ based on the full model, the derivatives of current i1 according to $V_{N1}$ and $V_{N2}$ are also calculated. The values of the derivatives of current i1 enable defining a plane tangent to semisphere 31 at the point of semi-sphere 31 corresponding to current $i_{j-x}$. This tangential plane indicates the direction of the variation of current i1 according to the variations of voltages $V_{N1}$ and $V_{N2}$ around point $P_{j-x}$. The portion of the tangential plane placed above the surface defined by circle 35 is an elliptic planar surface 40 in contact with semi-sphere 31 only above point $P_{j-x}$. Elliptic planar surface 40 is a representation of all the values of current i1 of the simplified model defined for current $i_{j-x}$. When the simplified model is used, the calculation of current i1 is performed from the equation of the tangential plane. This calculation requires a single calculation operation, which enables accelerating the simulation.

The compound model is, as for itself, a model of "fitting" between the "simplified" model and the "full" model. The values of current i1 of semi-sphere 31 corresponding to all the voltage couples $(V_{N1}, V_{N2})$ of circle 36 form a curve 41 closed on semi-sphere 31. A surface 42 representative of all the values of current i1 of the compound model has a substantially "truncated" conical shape having as a base closed curve 41 and, as a truncated upper surface, elliptic planar surface 40. The values of the current of surface 42 correspond to voltage couples $(V_{N1}, V_{N2})$ placed in a region 45 of plane portion 30 comprised between circles 35 and 36. The use of a compound model for the calculation of current i1 enables ensuring that the series of iterations performed to determine voltage couple $(V_{N1}, V_{N2})$ converges. The compound model indeed enables ensuring the continuity between the current values of elliptic planar surface 40 and the current values of semi-sphere 31 located outside of closed curve 41.

When the compound model is used for the calculation of current i1, it is necessary to define a set of equations which enables calculating current i1 according to a voltage couple $(V_{N1}, V_{N2})$. To simplify the determination of this equation set, the present invention provides determining a single equation enabling calculation of current i1 for a selected subset of couples $(V_{N1}, V_{N2})$ belonging to region 45.

Figure 8:
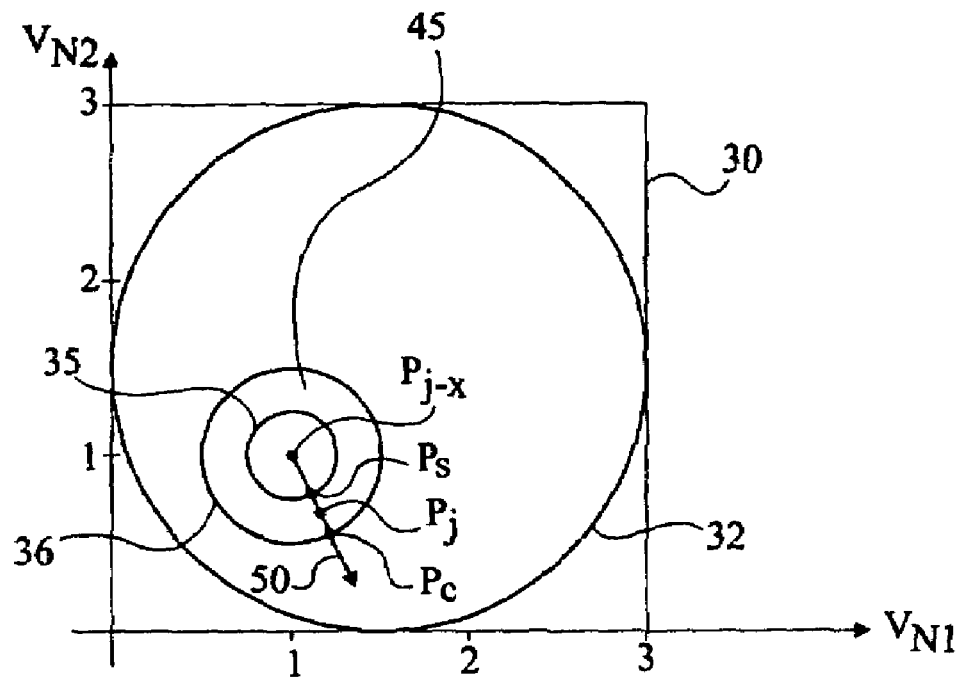
FIG. 8 is a two-dimensional representation comprising the elements of FIG. 6 plus other points.

FIG. 8 is a representation identical to that of FIG. 6. The coordinates of point $P_j$ are in this example 1.2/0.6. When the simulator detects that point $P_j$ belongs to region 45 of use of a compound model, it determines the coordinates of two points $P_S$ and $P_C$ respectively placed on circles 35 and 36 and placed on an axis 50 having as an origin point $P_{j-x}$ and passing through point $P_j$.

Figure 9:
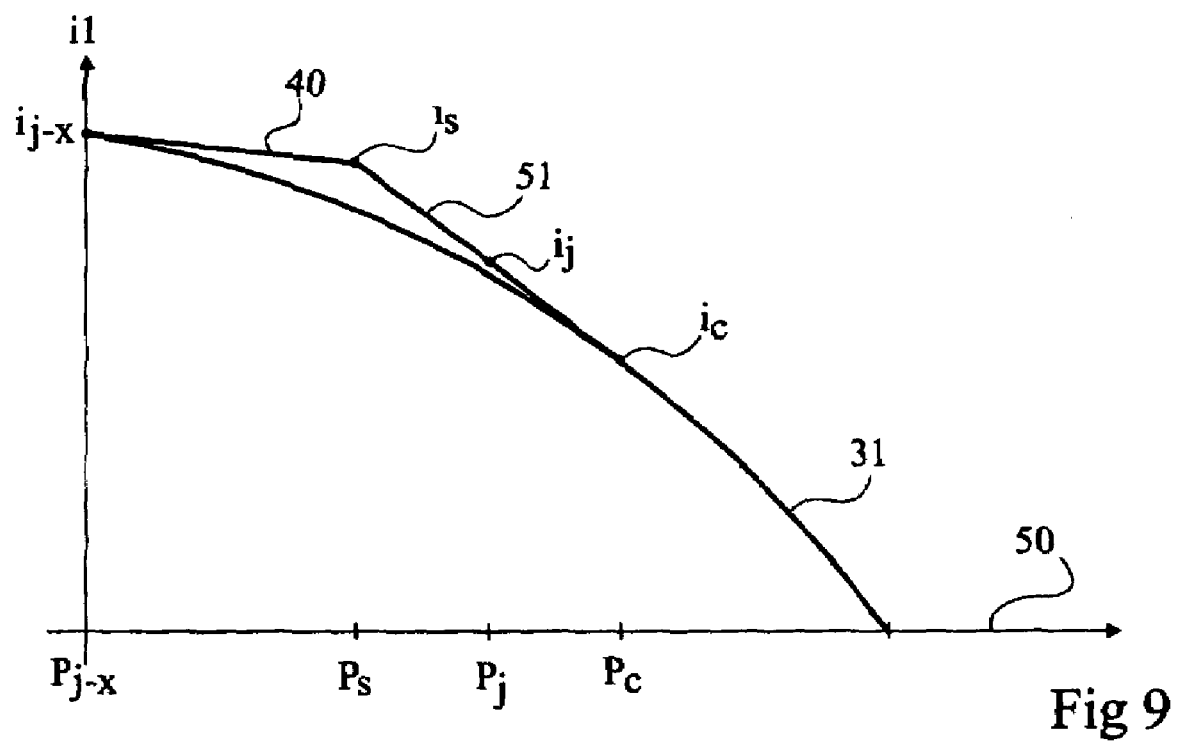
FIG. 9 is a cross-section view of a portion of the representation of FIG. 7.

FIG. 9 shows the values of current i1 corresponding to one of the three models for a voltage couple $(V_{N1}, V_{N2})$ belonging to axis 50. Current i1 is shown in ordinates, axis 50 corresponds to the abscissa axis. The simulator calculates value $i_S$ of current i1 corresponding to point PS based on the simplified model such as defined hereabove. The simulator then calculates value $i_C$ of current i1 corresponding to point $P_C$ based on the full model. The portion of straight line of elliptic planar surface 40 crossing current values $i_{j-x}$ and $i_S$ is tangent to a circular portion of semi-sphere 31 shown in FIG. 9. The current values representative of the compound model for voltage couples $(V_{N1}, V_{N2})$ of region 45 located on axis 50 between points $P_S$ and $P_C$ form a straight line portion 51 crossing current values $i_S$ and $i_C$. The calculation of current i1 corresponding to point $P_j$ is then performed from the equation of straight line portion 51. A current $i_j$ belonging to straight line portion 51 is obtained.

Generally, the current values representative of the compound model for voltage couples $(V_{N1}, V_{N2})$ belonging to axis 50 may form any type of curve between current values $i_S$ and $i_C$. So that the series of iterations of the calculation of current i1 converges more easily and more rapidly, a curve such that the derivatives of current i1 at point $P_S$ are identical for the simplified and compound model and such that the derivatives of current i1 at points $P_C$ are identical for the compound and full models may be defined.

After or in parallel with the calculation of current i1, currents i2 and i3 are similarly calculated. After verification of the mesh equation at node N2, a new calculation iteration is performed or not to determine the voltages/currents at simulation time $t_j$. In the example of component Z1, at a new calculation iteration for time $t_j$, it is determined whether the new voltage couple $(V_{N1}, V_{N2})$ estimated as being probable is remote or not from the voltage couple $(V_{N1}, V_{N2})_{j-x}$ determined for simulation time $t_{j-x}$ selected prior to the first calculation iteration. The remoteness is appreciated according to a method identical to that previously described in relation with FIG. 6. Current i1 is then calculated as described previously based on one of the three simplified, compound, or full models. After or simultaneously, the same calculation of currents i2 and i3 is performed for this new calculation iteration. After verification of the mesh equation, the series of iterations is continued according to an identical method until the mesh equation is verified.

Generally, the method of the present invention applies to any type of integrated circuit comprising several elementary components. Each component has one or several terminals, generally n terminals, each connected to a circuit node. For each component, a full model enables very accurately calculating each of the currents entering or coming out of the component through one of its terminals according to a set of n voltages at the nodes of which the component is connected. Each current entering one of the component's terminals can be represented by a hypersurface in an n+1-dimensional space according to the n voltages at the component's terminals.

Prior to the first calculation iteration performed to determine the voltages and currents of the circuit at a given time $t_j$, a previous simulation time $t_{j-x}$ for which the full model has been used to calculate the current values corresponding to the voltage set determined for this prior time is defined for each component. An n-dimensional space of possible voltage sets is then defined for each component, after which an interval between a point $P_{j-x}$ corresponding to the set of n voltages determined for time $t_{j-x}$ and a point $P_j$ corresponding to the set of n voltages estimated as being probable for time $t_j$ is then defined.

It is then determined for each component whether the calculated interval is smaller than a first threshold Vs1, ranges between first threshold Vs1 and a second threshold Vs2 greater than Vs1, or is greater than second threshold Vs2. According to cases, a simplified model, a compound model, or a full model are respectively used to calculate each of the currents entering or coming out of the considered component.

For each current entering or coming out of a given component, the sets of voltage sets distant from point $P_{j-x}$ by a threshold voltage Vs1 and by a threshold value Vs2 respectively form first and second "limiting" hyperspheres. The set of current values representative of the simplified model corresponds to a portion of a hyperplane tangent to the hypersurface representative of the full model for current value $i_{j-x}$ corresponding to point $P_{j-x}$. Each of the currents of the hyperplane portion corresponds to a voltage set located within the first limiting hypersphere. In the case where point $P_j$ is located inside or on this first limiting hypersphere, the current calculation is performed based on the equation of this "tangent" hyperplane. The set of current values representative of the compound model corresponds to a hypersurface of "fitting" between the above-mentioned hyperplane portion and a set of current values of the hypersurface representative of the full model corresponding to the voltage sets of the second limiting hypersphere. Each of the points of the "fitting" hypersurface corresponds to a voltage set located in a region defined by the first and second hyperspheres. The equation set providing the value of a current of the "fitting" hypersurface corresponding to a given voltage set of the above-mentioned region can be partially defined for a portion of the region according to a method similar to that described in relation with FIGS. 8 and 9.

Once all the circuit currents have been calculated, the mesh equation is verified for each of the circuit nodes. In the case where the mesh equation is not verified, a new calculation iteration is performed for time $t_j$. Keeping for each component the same "reference" point $P_{j-x}$ as that defined for the first iteration, it is determined as previously for each component whether the new voltage set estimated as being probable is remote or not from point $P_{j-x}$. According to the remoteness, one of the three simplified, compound, or full models is used to calculate the currents entering each component.

The selection for each component of a previous simulation time $t_j$-x for which the full model has been used to calculate the current values corresponding to the voltage set determined for this previous time may be performed in several ways. The previous time closest to given time $t_j$ for which the full model has been used may be selected. That for which the determined voltage set is closest to the voltage set estimated as probable for time $t_j$ may also be selected from among the previous times for which the full model has been used.

Threshold voltages Vs1 and Vs2 may be defined for each component type. In the case of a diode, threshold voltages Vs1 and Vs2 respectively equal to once or twice the intrinsic threshold voltage of the diode, that is, for example, a few hundreds of millivolts, may be defined. In the case of a resistor, "infinite" threshold voltages may be selected, given that the simplified and compound models are confounded with the full model whatever the voltage values.

Of course, the present invention is likely to have various alterations, modifications, and improvements which will readily occur to those skilled in the art. In particular, those skilled in the art may define other methods of estimation of the difference between the voltages at the nodes of which a component is connected between two simulation times.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method using a computer-implemented simulator for simulating an electric circuit comprising elementary components having each of their terminals connected to a circuit node, some nodes receiving external stimuli consisting of a series of voltage values applied at successive simulation times, comprising:

determining by the computer-implemented simulator at a given time the voltages at the circuit nodes by performing one or more calculation iterations by the computer-implemented simulator, each iteration comprising
defining a probable voltage for each node,
calculating currents entering or coming out of each of the components by using for each component a model based on the voltages at the component's terminals, then
verifying a mesh equation for each node,
wherein the iteration series continues until the mesh equation is verified by the computer-implemented simulator, and
the model in the step of calculating the currents for a first simulation time following an initial simulation time, is one of a simplified, a compound, or a full model for each component, the full model enabling determining the value of the current according to the voltages at the component's terminals, the simplified model corresponding to a tangential linearization of the full model around the value of the current corresponding to the voltages at the component's terminals determined for the initial time, and the compound model being a fitting of the simplified and full models by ensuring continuity of the currents, wherein
if the interval between the voltages at the component's terminals determined by the computer-implemented simulator for the initial simulation time and those probable for the first simulation time is smaller than a first threshold defined for this component, the simplified model is used by the computer-implemented simulator;
if the interval between the voltages at the component's terminals determined by the computer-implemented simulator for the initial simulation time and those probable for the first simulation time is greater than a second threshold defined for this component, the second threshold being greater than the first threshold, the full model is used by the computer-implemented simulator; and
if the interval between the voltages at the component's terminals determined by the computer-implemented simulator for the initial simulation time and those probable for the first simulation time is between the first and second thresholds for this component, the compound model is used by the computer-implemented simulator.

2. The method of claim 1, wherein for a given simulation time, a first calculation iteration comprises, prior to the calculation of the currents, an additional step consisting of selecting by the computer-implemented simulator for each component a simulation time prior to the given simulation time for which the currents entering or coming out of the component have been calculated based on the full model of the component, calculation of a current entering or coming out of a given component, in the first iteration and following ones, being performed based on one of the three simplified, compound or full models, the simplified model being defined around the value of the current corresponding to the voltages at the component's terminals determined for said prior simulation time, the selection of a model being
  a function of the interval between the voltages at the component's terminals determined for the selected prior simulation time and those probable for the given simulation time.

3. The method of claim 2, wherein for a component with n terminals, said interval is equal to the distance between first and second points of an n-dimensional space, the first point having as coordinates the voltages at the component's terminals probable for the given time, and the second point having as coordinates the voltages at the component terminals determined by the computer-implemented simulator for the selected prior simulation time.

4. The method of claim 3, wherein: all possible values of a current entering or coming out of a given component corresponding to the full model of the component forms a first hypersurface shown in an n+1-dimensional space comprising a current axis and a voltage space,
  sets of points of said voltage space, distant from the second point by a value equal to the first threshold voltage or equal to the second threshold voltage, form first and second hyperspheres,
  a set of current values representative of the simplified model of the component forms a portion of a hyperplane tangent to the first hypersurface for a current corresponding to the second point, each of the currents of the hyperplane portion corresponding to a point located within the first hypersphere,
  a set of current values representative of the compound component model forms a second hypersurface of fitting between the hyperplane portion and a subset of current values of the first hypersurface corresponding to the points of the second hypersphere.

5. The method of claim 4, wherein the compound component model is partially defined by the computer-implemented simulator as follows when said interval ranges between the first and second thresholds:
  the computer-implemented simulator defining third and fourth points corresponding to the intersection between an axis having as an origin the second point and passing through the first point and the first and second hyperspheres;
  the computer-implemented simulator calculating third and fourth current values corresponding to the third and fourth points based respectively on the simplified and full models of the component, and
  the computer-implemented simulator determining a third set of current values for each of the points of said axis between the third and fourth points, the third set of current values linking the third and fourth current values, the current value calculated for the first point being the value of the current of the third set corresponding to the first point.

6. The method of claim 2, wherein said selected prior simulation time is the time closest to the given simulation time for which the currents entering or coming out of the component have been calculated based on the full component model.

7. The method of claim 2, wherein the selected prior simulation time is such that the voltages at the component's terminals determined for the selected prior simulation time are the closest to the voltages at the component's terminals probable for the given simulation time and such that, for the voltages at the component's terminals determined for the selected prior simulation time, the currents entering or coming out of the corresponding component have been calculated based on the full model of the component.

* * * * *